US007554195B2

(12) United States Patent
Zingher et al.

(10) Patent No.: US 7,554,195 B2
(45) Date of Patent: Jun. 30, 2009

(54) ENGINE WITH CABLE DIRECT TO OUTBOARD MEMORY

(75) Inventors: Arthur R. Zingher, Mountain View, CA (US); Ashok Krishnamoorthy, San Diego, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 521 days.

(21) Appl. No.: 11/325,380

(22) Filed: Jan. 3, 2006

(65) Prior Publication Data

US 2007/0152344 A1 Jul. 5, 2007

(51) Int. Cl.
*H01L 23/34* (2006.01)

(52) U.S. Cl. ...................... 257/724; 257/723; 257/686; 257/784

(58) Field of Classification Search ................ 257/723, 257/724, 686, 777, 532, 784
See application file for complete search history.

(56) References Cited

U.S. PATENT DOCUMENTS 5,391,917 A * 2/1995 Gilmour et al. ............ 257/690
6,410,983 B1 * 6/2002 Moriizumi et al. .......... 257/723
6,462,412 B2 * 10/2002 Kamei et al. ................ 257/723
6,952,352 B2 * 10/2005 Emma et al. ................ 361/767
7,091,584 B2 * 8/2006 Quinlan et al. ............. 257/678
7,129,588 B2 * 10/2006 Shinomiya .................. 257/784
7,183,644 B2 * 2/2007 Wood et al. ................. 257/724
7,339,263 B2 * 3/2008 Stone et al. ................. 257/678

* cited by examiner

*Primary Examiner*—S. V Clark
(74) *Attorney, Agent, or Firm*—Park, Vaughan & Fleming LLP

(57) ABSTRACT

A device includes a first semiconductor die having a first surface and a second surface, a cable coupled to the first semiconductor die, and at least one memory device coupled to the cable. The first semiconductor die is configured to communicate by capacitive coupling using one or more of a plurality of proximity connectors proximate to and/or coupled to the first surface.

23 Claims, 7 Drawing Sheets

700

710

| | | | | | | | | | |
|---|---|---|---|---|---|---|---|---|---|
| 1 | 2 | 2 | 2 | 2 | 2 | 2 | 2 | 2 | 1 |
| | 2 | 2 | 2 | 2 | 2 | 2 | 2 | 2 | 2 |
| 2 | 2 | 2 | 3 | 3 | 3 | 3 | 2 | 2 | 2 |
| 2 | 2 | 3 | 3 | 3 | 3 | 3 | 3 | 2 | 2 |
| 2 | 2 | 3 | 3 | 3 | 3 | 3 | 3 | 2 | 2 |
| 2 | 2 | 3 | 3 | 3 | 3 | 3 | 3 | 2 | 2 |
| 2 | 2 | 3 | 3 | 3 | 3 | 3 | 3 | 2 | 2 |
| 2 | 2 | 2 | 3 | 3 | 3 | 3 | 2 | 2 | 2 |
| 2 | 2 | 2 | 2 | 2 | 2 | 2 | 2 | 2 | |
| 1 | 2 | 2 | 2 | 2 | 2 | 2 | 2 | 2 | 1 |

FIG. 7

ENGINE WITH CABLE DIRECT TO OUTBOARD MEMORY

GOVERNMENT LICENSE RIGHTS

This invention was made with United States Government support under Contract No. NBCH3039002 awarded by the Defense Advanced Research Projects Administration. The United States Government has certain rights in the invention.

BACKGROUND

1. Field of the Invention

The present invention relates to packaging techniques for semiconductor dies. More specifically, the present invention relates to packaging techniques for coupling memory devices with single-chip and/or multi-chip modules that include semiconductor dies that communicate signals using proximity connectors.

2. Related Art

In many existing computer systems, computational performance is often limited by a latency and/or bandwidth of interconnects between one or more processors, such as a central processing unit (CPU), and main memory. The latency and/or bandwidth may depend on variables such as packaging, connectors, and/or a printed circuit board or motherboard. In order to obtain a high-performance system, expensive and complicated components, such as a motherboard having multiple layers and a narrow critical dimension for wires, are often used. In addition, many systems include one or more cache memories proximate to the CPU to improve performance. Nonetheless, the main memory is often located a significant distance from the CPU and communication over this distance often occurs via a high-frequency data bus, which may limit performance.

Researchers have begun to investigate alternative techniques for communicating between semiconductor dies or chips. One promising technique involves integrating arrays of capacitive transmitters and receivers onto semiconductor chips to facilitate inter-chip communication. If a first chip is situated face-to-face with a second chip so that transmitter pads on the first chip are capacitively coupled with receiver pads on the second chip, it becomes possible to transmit data signals directly from the first chip to the second chip without having to route the data signals through intervening signal lines within a printed circuit board.

Capacitively coupled inter-chip communication may offer a high-bandwidth when communicating between adjacent chips and chips that are in close proximity to one another. Latency challenges, however, may occur when communicating over longer distances, such as in a multiple-chip module (MCM). This latency may impact communication between a CPU and an external cache and/or main memory, and therefore, may adversely affect the system performance.

What is needed is needed are packaging techniques for coupling memory devices to semiconductor chips or dies that communicate inter-chip signals using capacitive or proximity connectors without the problems listed above.

SUMMARY

Embodiments of a device are described. The device includes a first semiconductor die having a first surface and a second surface, a cable coupled to the first semiconductor die, and at least one memory device coupled to the cable. The first semiconductor die is configured to communicate by capacitive coupling using one or more of a plurality of proximity connectors proximate to and/or coupled to the first surface.

At least the one memory device may include a semiconductor memory. The semiconductor memory may include dynamic random access memory (DRAM), static random access memory (SRAM), magnetic random access memory (MRAM) and/or another memory technology. In some embodiments, the cable includes one or more memory connectors.

At least the one memory device may include a plurality of memory devices. A first subset of the plurality of memory devices may be coupled to the cable proximate to a first end of the cable that is proximate to the first semiconductor die. A second subset of the plurality of memory devices may be coupled to the cable proximate to a second end of the cable that is distal from the first semiconductor die. Memory devices in the first subset of the plurality of memory devices may have access times less than or equal to a first threshold value and memory devices in the second subset of the plurality of memory devices have access times greater than or equal to the first threshold value.

A first section of the cable coupled to the first semiconductor die may have a first flexibility compliance less than a second threshold value. Flexibility compliance is a measure of a local ease of bending of the cable, such as an inverse of a local spring constant. A second section of the cable coupled to at least the one memory device may have a second flexibility compliance less than the second threshold value. A third section of the cable may have a third flexibility compliance greater than the second threshold value. The third flexibility compliance of the third section may allow at least a portion of the cable to be positioned substantially perpendicular to a plane including the first surface.

The cable may include at least one multilayer elements. At least the one multilayer element may have a first metal layer, a dielectric layer and a second metal layer. At least the one multilayer element may comprise a transmission line. In some embodiments, there may be at least two mechanically distinct multilayer elements in at least one section of the cable. At least the one multilayer element may include at least one stiffener element in at least one section of the cable. The cable may include a central section coupled to the first semiconductor die. The cable may have four arms coupled to the central section and arranged with substantially 4-fold symmetry.

In some embodiments, the device includes a second semiconductor die electrically and thermally coupled to the first semiconductor die. The cable may be further coupled to the second semiconductor die.

In some embodiments, the device includes a memory board coupled to the cable and the second subset of the plurality of memory devices. In some embodiments, the device includes a memory controller coupled to the memory board. The memory board may be coupled to the cable using a connector.

In some embodiments, the device includes a first voltage regulator coupled to the cable proximate to the first end of the cable that is proximate to the first semiconductor die. The first voltage regulator may be configured to provide power to the first semiconductor die. In some embodiments, the device includes a second voltage regulator coupled to the cable proximate to the second end of the cable that is distal from the first semiconductor die. The second voltage regulator may be configured to provide power to at least the one memory device.

In some embodiments, the device includes a first electro-optic transceiver coupled to the cable proximate to the first end of the cable that is proximate to the first semiconductor die. In some embodiments, the device includes a second electro-optic transceiver coupled to the cable proximate to the second end of the cable that is distal from the first semiconductor die.

The device may reduce or eliminate the challenges associated with existing packaging techniques.

BRIEF DESCRIPTION OF THE FIGURES

FIG. 7 is a block diagram illustrating a top view of an embodiment of a multi-chip module.

Like reference numerals refer to corresponding parts throughout the drawings.

DETAILED DESCRIPTION

Figure 1A:
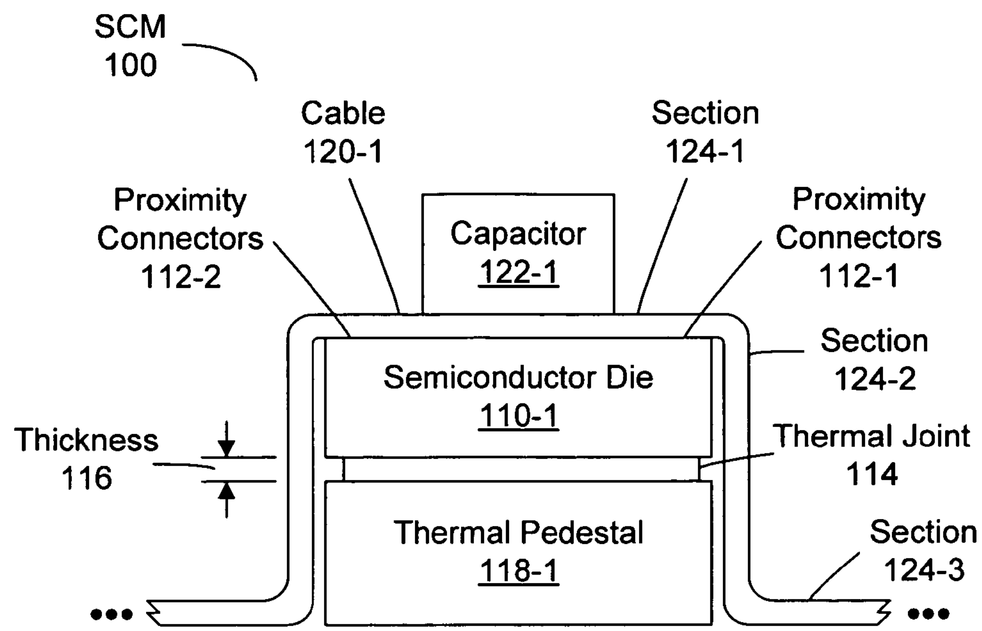
FIG. 1A is a block diagram illustrating a side view of an embodiment of a single-chip module.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a semiconductor die, single-chip module (SCM) and a multi-chip module (MCM) that includes an array of SCMs are disclosed. The semiconductor die includes integrated circuit electronics corresponding to layers deposited on a semiconductor substrate. When packaged, for example in the SCM, one or more semiconductor dies are sometimes referred to as a chip. The MCM may include two or more SCMs.

The semiconductor dies may be configured to communicate data signals between semiconductor dies using proximity communication, such as capacitive coupling between two or more proximity connectors or pads in closely spaced arrays of a plurality of proximity connectors or pads. Proximity communication may increase a bandwidth and/or a number of data signal channels for inter-chip communication. In some embodiments, proximity connectors may be on or proximate to at least one surface of the semiconductor die, the SCM and/or the MCM. In other embodiments, the semiconductor die, the SCM and/or the MCM may be coupled to the proximity connectors. In exemplary embodiments, the plurality of proximity connectors are approximately located at one or more corners and/or edges of a respective semiconductor die.

In order to communicate data signals using proximity communication, transmit and receive proximity connectors on adjacent semiconductor dies may have, at worst, only limited misalignment, i.e., substantially accurate alignment both in a first plane defined by at least some of the proximity connectors and in a direction perpendicular to the first plane. Misalignment in the first plane may cause each receiving proximity connector to span two transmitting proximity connectors, thereby destroying a received signal. In theory, satisfactory communication requires alignment such that misalignment is less than half of a pitch between the proximity connectors. In practice, the alignment requirements may be more stringent. In addition, limiting overall misalignment may improve communication performance between the semiconductor dies, SCMs and/or MCMs and reduce power consumption.

For densely packed proximity connectors, i.e., connectors having a small spacing or pitch between adjacent pads, such alignment between two or more proximity connectors on adjacent semiconductor dies may be within a few microns in a first direction (X) and/or a few microns in a second direction (Y) in the first plane including at least some of the proximity connectors, and/or within a few microns in an out-of-plane or third direction (Z) approximately perpendicular to the first plane. In some embodiments, the proximity connectors may be aligned in six degrees of freedom, including the first direction (X), the second direction (Y), the third direction (Z), an angle in the first plane defined by the first direction (X) and the second direction (Y), an angle in a second plane defined by the first direction (X) and the third direction (Z), and an angle in a third plane defined by the second direction (Y) and the third direction (Z). In some embodiments, allowed misalignment in the first direction (X), the second direction (Y) and/or the third direction (Z) is less than one half of the pitch between adjacent pads. For example, misalignment in the first direction (X) and/or the second direction (Y) may be less than 25 μm, and misalignment in the third direction (Z) may be less than 5 μm.

It may, however, be challenging to align semiconductor dies, SCMs and/or MCMs due to effects such as thermal expansion, mechanical vibrations, a non-planar surface (for example, due to quadrapole distortion) of one or more adjacent semiconductor dies or chips, as well as manufacturing and assembly perturbations that result in misalignment problems. The semiconductor die, the SCM and/or the MCM may, therefore, include solutions to packaging challenges such as at least some of the misalignment problems associated with proximity communication using the plurality of proximity connectors. Reducing or eliminating such misalignment, in turn, may increase a magnitude of the data signals.

In some embodiments, the solutions may reduce and/or eliminate misalignment in the third direction (Z). These solutions may include self-alignment, self-adjustment and/or self-balancing (for example, using symmetric layers deposited on both sides of the respective semiconductor die to reduce or eliminate quadrapole distortion) of relative positions of the proximity connectors on adjacent semiconductor dies or chips in the third direction (Z). For example, alignment in the third direction (Z) may be improved through the use of structures that have flexibility compliance (like a spring). The structures may be implemented in a respective semiconductor die, on two or more semiconductor dies, and/or in a component coupling two or more semiconductor dies. In other embodiments, a feedback control loop may be used to reduce and/or eliminate the misalignment in the third direction (Z).

The structures may be implemented by a selective removal or addition of material to the respective semiconductor die or component to allow flexibility compliance of at least a portion of the respective semiconductor die or component. These structures may reduce or eliminate a need for narrow tolerances and precise manufacturing of the semiconductor die, the SCM and/or the MCM. In addition, precise assembly may not be needed. Moderate forces between semiconductor dies, SCMs and/or MCMs and small movements of the semiconductor dies, the SCMs and/or the MCMs may counteract thermal distortions, mechanical vibrations, external forces, fabrication tolerances and assembly perturbations that result in misalignment problems.

In addition, the solutions may reduce misalignment in the first plane, i.e., the plane including at least some of the proximity connectors, when used in conjunction with techniques such as electronic steering (where data signals are routed to respective proximity connectors in accordance with the alignment in the first plane). As a consequence, these solutions may facilitate proximity communication between the semiconductor dies in SCMs and/or MCMs by reducing the aforementioned misalignment and enabling capacitive coupling by increasing data signals and/or overlapping one or more proximity connectors on adjacent or proximate semiconductor dies.

The semiconductor die, the SCM and/or the MCM may adapt materials, processes and tools that are known in the art in order to improve feasibility, i.e., to reduce expenses associated with manufacturing and assembly of the semiconductor die, the SCM and/or the MCM.

The SCM and/or the MCM may include one or more cables coupled to one or more of the semiconductor dies. A flexibility compliance of at least one section of a respective cable may be greater than a threshold value. In addition, the flexibility compliance of at least another section of the respective cable may be less than the threshold value. Thus, the respective cable may have substantially flexible and substantially rigid sections. In some embodiments, the respective cable may be a semi-flexible flat cable. The flexibility compliance of at least the one section of the respective cable may allow it to be bent. At least a portion of the respective cable may, therefore, be position approximately parallel to the third direction (Z).

The respective cable may be coupled to various types of memory devices, such as a semiconductor memory, an organic memory, a magnetic or spintronic memory and/or another type of memory. The various types memory devices may include one or more memory devices. The respective cable may have four arms coupled to a central section and arranged with substantially 4-fold symmetry. The central section may be coupled to one or more semiconductor dies. Semiconductor memory may include dynamic random access memory (DRAM) and/or static random access memory (SRAM). Magnetic or spintronic memory may include magnetic random access memory (MRAM).

In some embodiments, the respective cable includes one or more memory connectors. In some embodiments, a first subset of the plurality of memory devices may be coupled to a section of the respective cable having flexibility compliance less than the threshold value, i.e., a substantially rigid section. In some embodiments, the respective cable may be coupled to one or more memory boards. The respective cable may be coupled to the one or more memory boards using one or more connectors. The one or more memory boards may be coupled to a second subset of the plurality of memory devices. A respective memory board may include one or more memory controllers. In some embodiments, one or more memory devices in the first subset of the plurality of memory devices and/or the second subset of the plurality of memory devices may be configured as a memory module.

In some embodiments, the first subset of the plurality of memory devices may be coupled to the respective cable proximate to a first end of the cable that is proximate to a respective semiconductor die. A second subset of the plurality of memory devices may be coupled to the respective cable proximate to a second end of the cable that is distal from the respective semiconductor die. The one or more memory devices in the first subset of the plurality of memory devices may have access times greater than a first threshold value. In some embodiments, the respective semiconductor die may include one or more processors or CPUs and the one or more memory devices in the first subset of the plurality of memory devices may constitute an external memory cache. The external memory cache is sometimes referred to as inboard memory. The external memory cache is sometimes referred to as an intermediate L3 near-by memory or cache. Such an L3 cache is further away then L1 and L2 memory or cache on the first semiconductor die, but is closer than the external main memory. The L3 cache feeds an L2 cache, which feeds an L1 cache, which feeds the CPU. The L1 and L2 caches may be proximate to the respective semiconductor die or integrated with the processor or CPU on the respective semiconductor die.

The one or more memory devices in the second subset of the plurality of memory devices have access times less than the first threshold value. In some embodiments, the one or more memory devices in the second subset of the plurality of memory devices may constitute main memory for one or more processors and/or CPUs on one or more semiconductor dies. The main memory is sometime referred to as outboard memory. The one or more memory devices in the second subset of the plurality of memory devices may include commodity memory devices. In the discussion below, semiconductor dies that include one or more processors or CPUs and are coupled to an external memory cache and/or main memory via the cable are sometimes referred to as engines.

In some embodiments, the SCM and/or MCM may include a first voltage regulator coupled to the respective cable proximate to the first end of the cable that is proximate to the first semiconductor die. The first voltage regulator may be configured to provide power to the respective semiconductor die. In some embodiments, a second voltage regulator is coupled to the respective cable proximate to the second end of the cable that is distal from the respective semiconductor die. The second voltage regulator may be configured to provide power to at least the one memory device.

In some embodiments, the SCM and/or MCM may include a first electro-optic transceiver coupled to the respective cable proximate to the first end of the cable that is proximate to the first semiconductor die. In some embodiments, a second electro-optic transceiver is coupled to the respective cable proximate to the second end of the cable that is distal from the first semiconductor die.

By combining proximity communication in the first plane with coupling to one or more memory devices approximately along the third direction (Z) using one or more cables, embodiments of the SCM and/or the MCM may reduce or eliminate the packaging and interconnect challenges in existing computer systems. In particular, the SCM and/or the MCM may offer improved communication (high-bandwidth, low latency) of data signals between one or more processors or CPUs, which utilize proximity communication to communicate with adjacent and/or neighboring semiconductor dies, and an external memory cache and/or main memory that is located at a distance from the one or more processors or CPUs. The SCM and/or the MCM may reduce an overall cost associated with such improved performance. The SCM and/ or MCM may enable a memory hierarchy where one or more engines logically encompasses both inboard and outboard memory. For example, a memory controller for the inboard memory may be included on the respective semiconductor die in the SCM and/or MCM and a memory controller for the outboard memory may be included on the one or more memory boards coupled to the one or more cables. This architecture, therefore, facilitates a transparent cache with virtual addresses in a decentralized array of SCMs in the MCM. In addition, this architecture may allow sharing of one or more memory devices with one or more processors or CPUs.

While the discussion below focuses on capacitive coupling between adjacent semiconductor dies, in some embodiments other and/or additional connectors may be overlapped on adjacent semiconductor dies. One embodiment uses magnetic proximity connectors, where data signals are communicated magnetically between terminals on closely adjacent semiconductor dies. Another embodiment uses optical proximity connectors, where data signals are communicated optically between terminals on adjacent semiconductor dies. Another embodiment may couple connectors in adjacent semiconductor dies using an array of tiny solder balls.

Attention is now directed towards embodiments of the SCM and/or the MCM with one or more cables coupled to one or more memory devices. FIG. 1A illustrates a side view of an embodiment of a single-chip module (SCM) 100. The SCM 100 includes a first semiconductor die 110-1 having a first surface and a second surface. In some embodiments, the first semiconductor die 110-1 may include a plurality of proximity connectors 112 located on, coupled to and/or proximate to the first surface. For example, the plurality of proximity connectors 112 may be situated beneath a protective layer such that they are located below the first surface. While the SCM 100 illustrates the plurality of proximity connectors substantially located at one or more corners of the first semiconductor die 110-1, in other embodiments the plurality of proximity connectors 112 may be situated at an arbitrary location(s) on and/or proximate to the first surface. In other embodiments, the plurality of proximity connectors 112 may be coupled to the first semiconductor die 110-1, for example, using a cable. One or more of the plurality of proximity connectors 112 may enable communication of data signals by capacitive coupling. The first semiconductor die 110-1 may also include wiring and electronics to relay the data signals to a center of the semiconductor die where there may be additional electronics such as logic, one or more caches, and/or one or more processors or CPUs.

Figure 4:
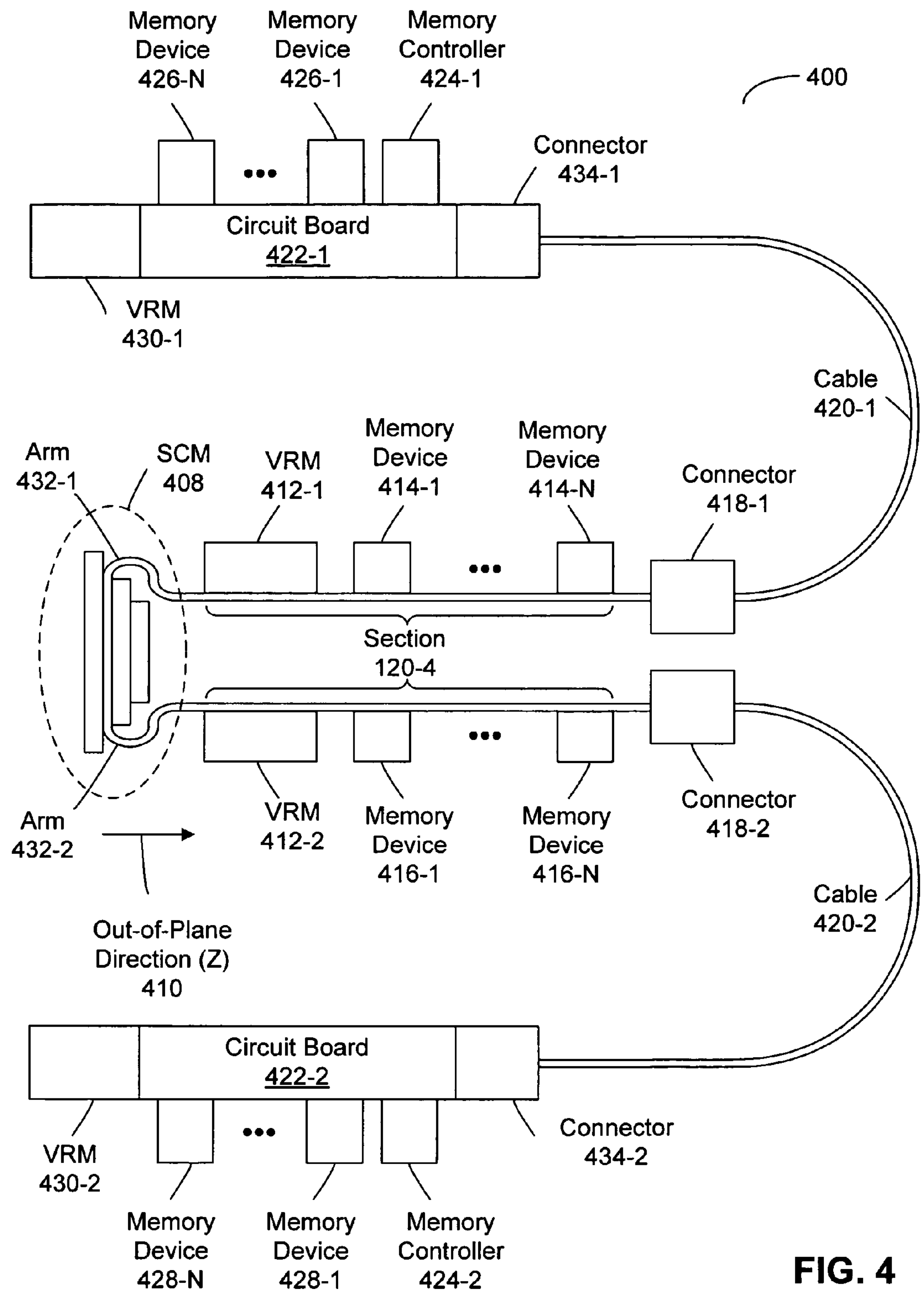
FIG. 4 is a block diagram illustrating an embodiment of a single-chip module coupled to memory devices.

The first semiconductor die 110-1 may be coupled to a cable 120-1, having a first section 124-1, a second section 124-2 and a third section 124-3. In some embodiments, the first section 124-1 of the cable 120-1 may be coupled to the first surface. In other embodiments, the first section 124-1 of the cable 120-1 may be coupled to terminals located in several different planes substantially parallel to the first surface. As described below with reference to FIGS. 4 and 5, the cable 120-1 may couple data signals to and from the semiconductor die 110-1 to one or more memory devices. In addition, the cable 120-1 may couple electrical power signals, such as positive and negative currents, to the first semiconductor die 110-1 from one or more voltage regulation modules (VRMs) 412 (FIG. 4).

A flexibility compliance of at least one section of the cable 120-1, such as the second section 124-2, may be greater than a first threshold value. In addition, the flexibility compliance of at least another section of the cable 120-1, such as the first section 124-1 and/or the third section 124-3, may be less than the first threshold value. Thus, the cable 120-1 may have substantially flexible and substantially rigid sections. In some embodiments, the cable 120-1 may be a semi-flexible flat cable. As discussed further below with reference to FIGS. 4 and 5, the flexibility compliance of at least the one section (such as 124-2) of the cable 120-1 may allow the at least a potion of the cable 120-1 to be positioned approximately parallel to an out-of-plane direction (Z) 410 (FIG. 4), i.e., approximately perpendicular to the first surface.

A decoupling capacitor 122-1 may be coupled to the cable 120-1 such that the cable 120-1 is sandwiched between the capacitor 122-1 and the first surface of the first semiconductor die 110-1. A capacitance C between the capacitor 122-1 and a ground and an inductance L of the cable 120-1 may result in an LC time constant substantially less than 1 ns. The cable 120-1 and the capacitor 122-1 may distribute electrical power to the first semiconductor die 110-1 and thereby partly bypass resistance and inductance of metal layers on the first semiconductor die 110-1.

In some embodiments, the SCM 100 may include a thermal pedestal 118-1 coupled to the second surface of the first semiconductor die 110-1 via a thermal joint 114. The thermal pedestal 118-1 may be a material with a high thermal conductivity. The thermal pedestal 118-1 may be copper or a material with a thermal expansion coefficient similar to that of the first semiconductor die 110-1. The thermal joint 114 has an average thickness 116. The thermal joint 114 may include a solder (such as lead-tin, indium or other alloys), a shearable layer of oil, a thermal paste and/or a coating that reduces static friction. Additional teaching regarding the thermal joint 114 is provided in U.S. Pat. No. 5,291,371, the contents of which are herewith incorporated by reference.

In an exemplary embodiment, the thermal joint 114 may use a re-flowed solder, i.e., a solder that is melted and the solidified, to relieve initial perturbations associated with assembly of the SCM 100 and/or to fill large gaps. The re-flowed solder may also compensate for non-planarity of the semiconductor die 110-1. The re-flowed solder may have high-quality surfaces without so-called solder skin and/or air gaps. The re-flowed solder may have a thickness of 25 μm corresponding to the thickness 116. The thermal joint 114 may also include one or more thin layers that are permanently shearable, such as a micron-thin layer of oil and/or an ultra-thin (thickness less than 1 μm) anti-adhesion coating on at least one surface in the thermal joint 114. This may allow perturbations, such as thermal distortions, in the plane of the first surface of the first semiconductor die 110-1 to be relieved thereby enabling self-alignment, self-adjustment and an avoidance or a reduction in stress. Alternatively, the thermal joint 114 may include a thermal paste with grains of metal or liquid metal having a diameter that is less than a desired tolerance in the out-of-plane direction (Z) 410 (FIG. 4).

In some embodiments, the thermal pedestal 118-1 may be rigidly bonded to the first semiconductor die 110-1. While this may help reduce heat spreading, a substantial heat flux may conduct through the thermal pedestal 118-1. This may result in key-stone shaped thermal distortion. Therefore, if the thermal pedestal 118-1 is bonded to the first semiconductor die 110-1 misalignment may result. The embodiments having loose mechanical coupling in the thermal joint 114, described in the preceding paragraph, represent a tradeoff between thermal conduction and flexibility compliance.

Figure 1B:
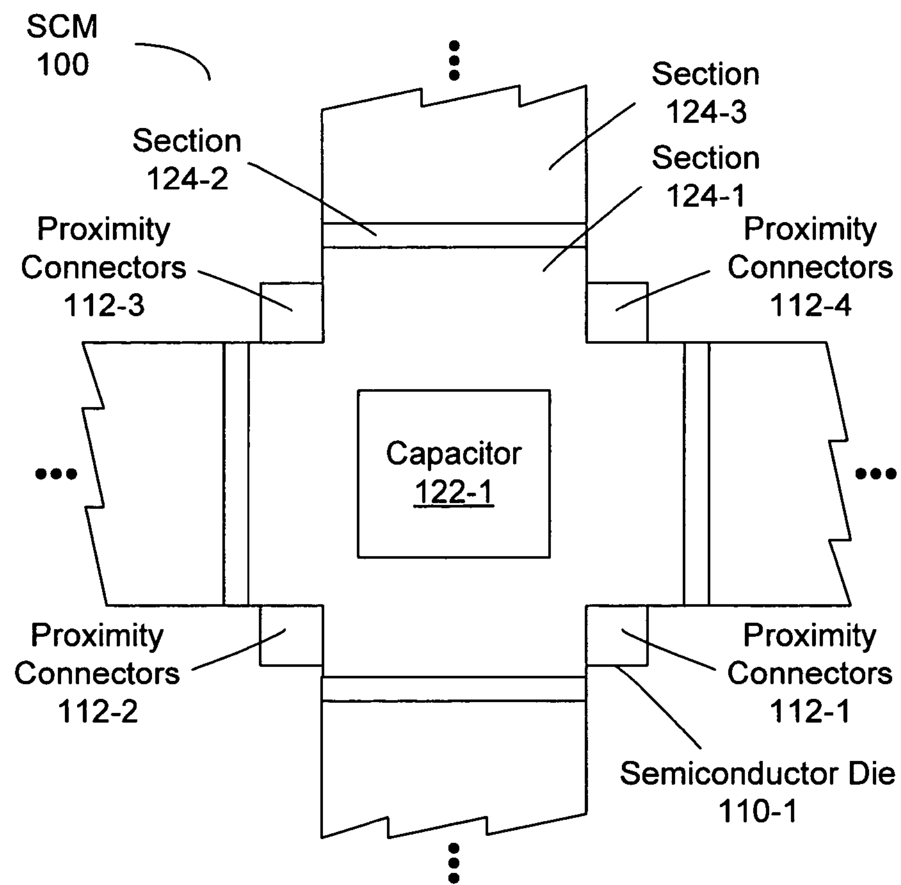
FIG. 1B is a block diagram illustrating a top view of an embodiment of a single-chip module.

FIG. 1B illustrates a top view of an embodiment of the SCM 100. The cable 120-1 may have a central section, such as the first section 120-1, coupled to the first semiconductor die 110-1. The cable 120-1 may have four arms or pedals coupled to the central section and arranged with substantially 4-fold symmetry. In an exemplary embodiment, the central section of the cable 120-1 may have dimensions of 14×14 $mm^2$ and each of the pedals may have dimensions of 14×70 $mm^2$.

It should be understood that the SCM 100 is illustrative of the components and functionality of the SCM. In additional embodiments, the SCM 100 may include fewer or additional components. In addition, two or more components may be combined into a single component. In some embodiments, the cable 120-1 may be coupled to another location on the first semiconductor die 110-1.

Figure 2A:
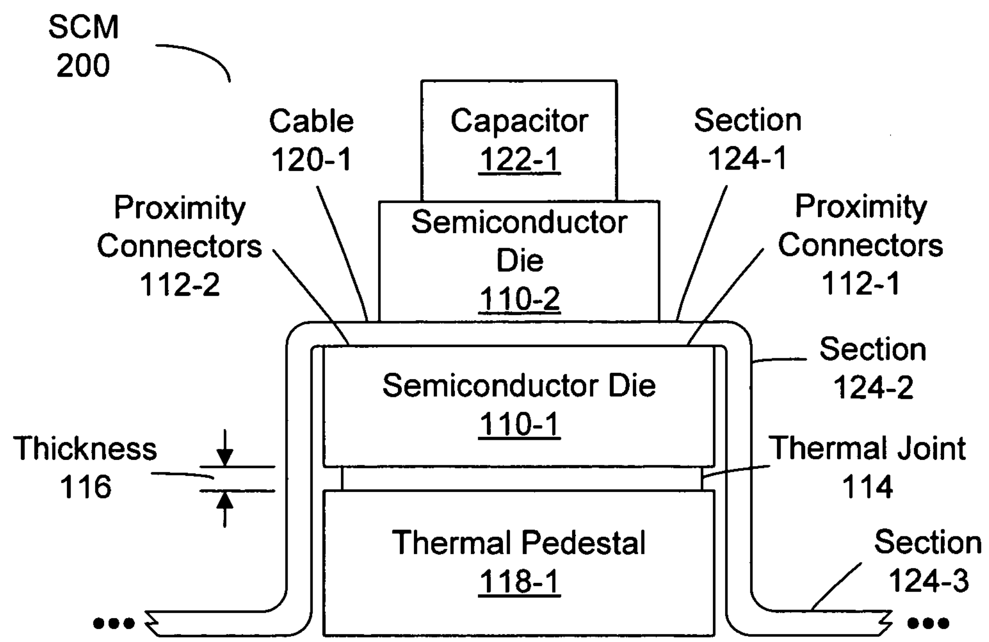
FIG. 2A is a block diagram illustrating a side view of an embodiment of a single-chip module.

FIG. 2A illustrates a side view of an embodiment of an SCM 200. The SCM 200 includes a second semiconductor die 110-2 that is electrically coupled (for example, using one or more vias) and/or thermally coupled to the first surface of the first semiconductor die 110-1 via a coupling through the cable section 124-1. The coupling has an average thickness (not shown). In the SCM 200, the capacitor 122-1 is coupled to the second semiconductor die 110-2. In embodiments such as the SCM 100, the first semiconductor die 110-1 is sometimes referred to as a carrier and the second semiconductor die 110-2 is sometimes referred to as a payload. In some embodiments, the payload may include one or more processors or CPUs.

Figure 2B:
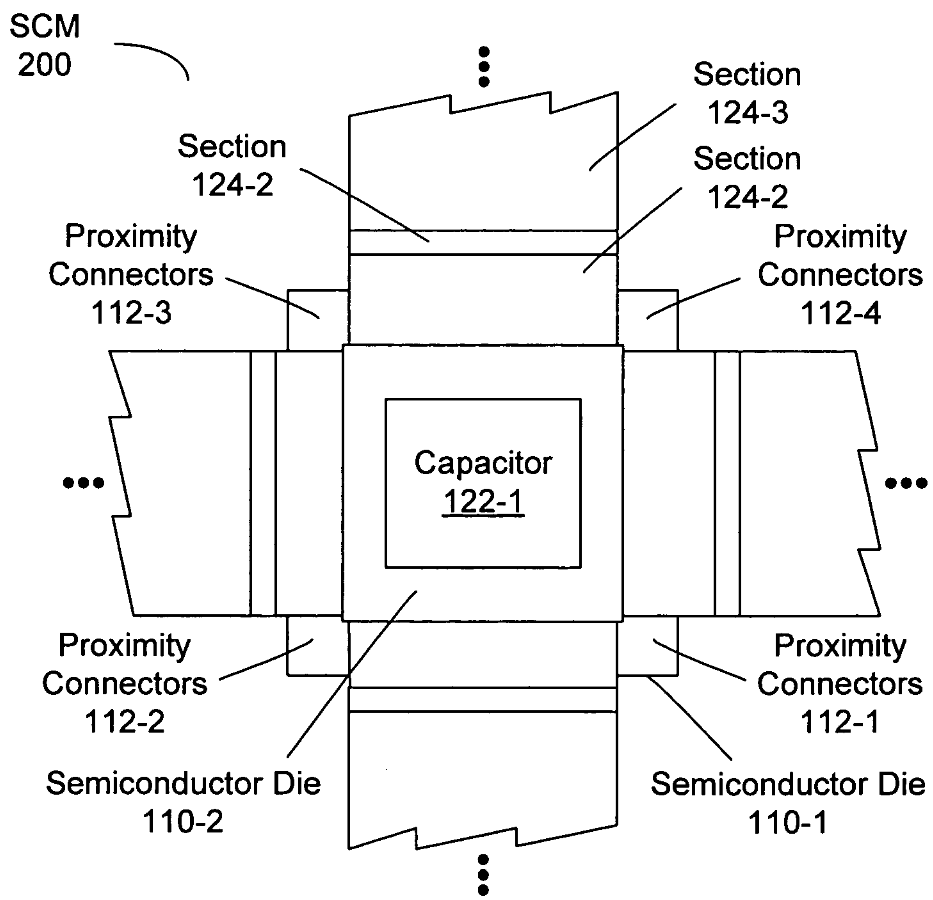
FIG. 2B is a block diagram illustrating a top view of an embodiment of a single-chip module.

FIG. 2B illustrates a top view of an embodiment of the SCM 200. The cable 120-1 may be coupled to the first semiconductor die 110-1 and/or the second semiconductor die 110-2.

It should be understood that the SCM 200 is illustrative of the components and functionality of the SCM. In additional embodiments, the SCM 200 may include fewer or additional components. For example, there may be one or more additional payload semiconductor dies in the SCM 200. These additional payload semiconductor dies may be laminarly stacked on top of one another. In addition, two or more components may be combined into a single component.

Figure 3:
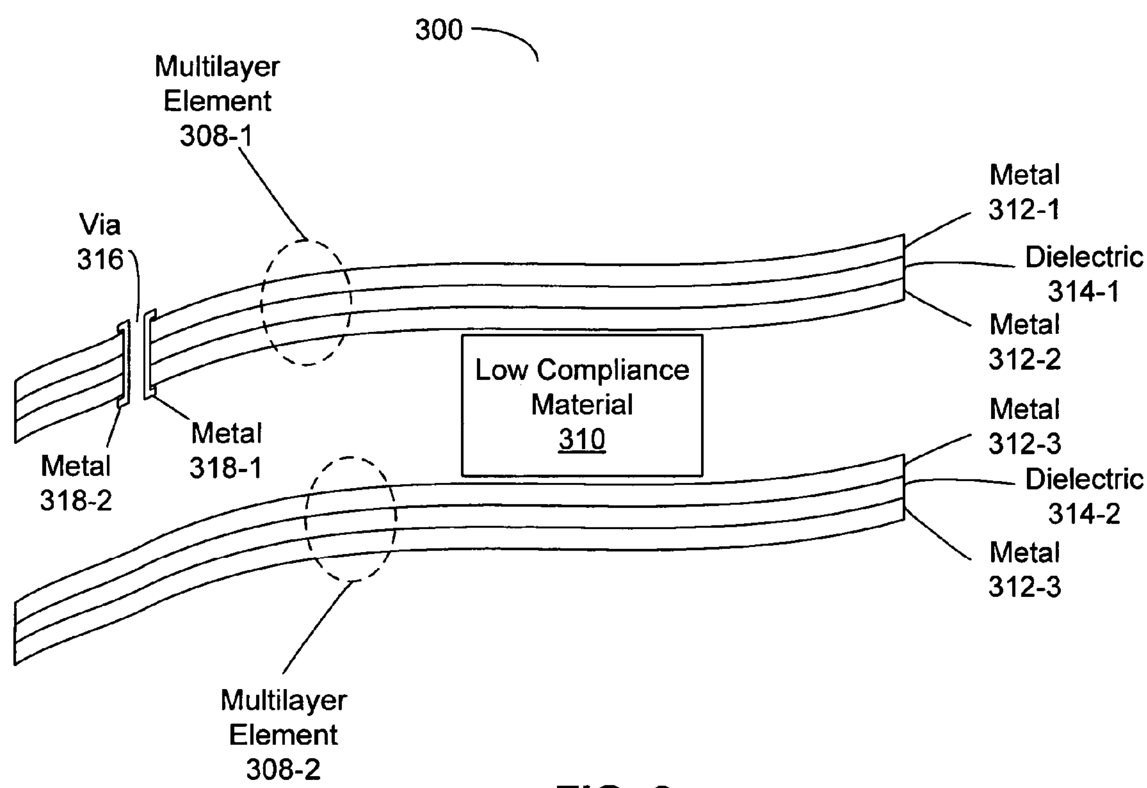
FIG. 3 is a block diagram illustrating an embodiment of a flexible cable.

FIG. 3 is a block diagram illustrating an embodiment of a flexible cable 300, such as the cable 120-1 (FIGS. 1A and 2A). The cable 300 includes at least two multilayer elements 308. Each multilayer element 308 has at least a first and a second metal layer 312, and a dielectric layer 314, such as polyimide. Each multilayer element 308 may constitute a high-frequency transmission line having a 3 dB bandwidth in excess of 5 GHz.

At least the two multilayer elements 308 may be mechanically distinct in at least a section of the cable 300, such as the second section 124-2 (FIGS. 1A and 2A). For example, at least the two multilayer elements 308 may be able to move or be displaced with respect to one another. In at least this section, the cable 300 may have the flexibility compliance greater than the first threshold value. The flexibility compliance may be inversely proportional to the effective local spring constant for local bending of the cable 300. In at least one other section of the cable 300, such as the first section 124-1 and/or the third section 124-3 (FIGS. 1A and 2A), the two multilayer elements 308 may include one or more stiffener elements resulting in the flexibility compliance that is less than the first threshold value. In an additional section of the cable 300, which may not correspond to some or all of the first section 124-1 and/or the third section 124-3 (FIGS. 1A and 2A), the multilayer elements 308 may be mechanically coupled to an optional low compliance material 310. The cable 300 may include one or more vias, such as via 316. The via 316 may pass through the multilayer element 308. Sides of the via 316 may be coated or plated with metal 318.

While the cable 300 includes two multilayer elements 308 and one via 316, other embodiments may include fewer or additional multilayer elements 308 and/or additional vias. In an exemplary embodiment, the cable 300 may include several hundreds of signal wires plus ground planes across its width. There may be at least three separate layers, which each may include one or more multilayer elements 308, for communicating data signals and power. At least the power layer may have a low DC resistance, a low inductance and a low AC impedance. For example, the power layer may have a DC resistance of 0.3μΩ (with 10 kA of current) and an AC impedance less than 30μΩ up to frequencies of a few GHz. In another example, a DC resistance may be less than 0.5μΩ and an AC impedance may be less than 25μΩ at frequencies up to 3 GHz. In some embodiments, the electrical power is distributed with high current and low voltage.

In an exemplary embodiment, the cable 300 and/or the cable 120-1 (FIGS. 1A and 2A) may use so-called rigid-flex printed wiring. This combines rigid printed wiring, henceforth referred to a rigid PW, and flexible printed wiring, henceforth referred to as flex PW. The cable 300 and/or the cable 120-1 (FIGS. 1A and 2A) may have the flat central area surrounded by four 'legs'.

Rigid PW may include dielectric layers, such as the dielectric layers 314, with a stiffener, such as glass fibers. Rigid PW facilitates vias, such as the via 316, terminals and solder bonding. Rigid PW may be used in the central area. In addition, as discussed below with reference to FIGS. 4 and 5, rigid PW may be used in a region of the cable 300 that is coupled to one or more memory devices. The central area may be bonded to one or more semiconductor dies, such as the first semiconductor die 110-1 (FIGS. 1A and 2A) and/or the second semiconductor die 110-2 (FIG. 2A), using a so-called C4-style array of tiny solder balls (such as a ball-grid array) and underfill. This enables a dense array of bonds. In some embodiments, other bonds to the cable 300, such as those to one or more connectors, one or more memory connectors and/or one or more memory devices, may use so-called pin-grid-array solder balls without any underfill. The pin-grid-array solder balls are larger than the C4-style solder balls. This may enable a less dense but reworkable array of bonds.

In embodiments of the SCM, such as the SCM 200 (FIGS. 2A and 2B), including the first semiconductor die 110-1 and the second semiconductor die 110-2, the rigid PW in the cable 120-1 (FIGS. 2A and 2B) may include terminals in different planes substantially parallel to the first surface of the first semiconductor die 110-1 (FIG. 2A). For example, some areas of the cable 120-1 (FIG. 2A) may include an extra-thick layer.

Flex PW may be used in the second section 124-2 of the cable 120-1 (FIGS. 1A and 2A). Several features make the flex PW have increased flexibility compliance. Notably, dielectric layers, such as the dielectric layers 314, may not include a stiffener, i.e., a material with low flexibility compliance, such as the glass fibers. In addition, in contrast with materials such as plywood that have reduced flexibility compliance due to multiple layers that are fully bonded together, flex PW is composed of subunits, such as the multilayer elements 308, without adhesion between the subunits. Where the flex PW meets the rigid PW at least some of these subunits may be electrically connected in parallel.

In some embodiments, the flex PW may include one or more slits to increase the flexibility compliance of the cable 300 and/or the cable 120-1 (FIGS. 1A and 2A).

FIG. 4 is a block diagram illustrating an embodiment 400 of an SCM 408 coupled to memory devices 414, 416, 426 and 428. The SCM 408 may include one or more semiconductor dies. In an exemplary embodiment, the SCM 408 includes a carrier semiconductor die and a payload semiconductor. The carrier and/or payload semiconductor dies may include one or more processors or CPUs and/or logic circuits for controlling the memory devices 414 and 416 that are proximate to the SCM 408. One or more of the semiconductor dies may include logic circuits to control proximity communication. In some embodiments, one or more of the semiconductor dies may include logic circuits for controlling the memory devices 426 and 428. In some embodiments, one or more of the semiconductor dies may include an L1 and/or an L2 cache. At least a portion of the L1 and/or L2 cache may be dedicated to one or more cores or strands in a respective processor or CPU. Such a cache is sometimes referred to as private.

In some embodiments, the logic circuits may include an L3 cache controller and an L3 cache address table. The address table may translate between virtual and physical address space, and describe current contents of an L3 cache. The L3 cache controller and/or L3 cache address table may guide data requests (such as read and/or write commands, as well as data migration between levels in a memory hierarchy) to an L3 cache (for example, memory devices 414 and 416) and/or a main memory (for example, memory devices 426 and 428). In an exemplary embodiment, the L3 controller and/or the L3 address table are shared by some or all of the cores or strands in the respective processor and/or CPU. By encapsulating the L3 cache and main memory command protocols within a respective engine, address translation may be transparent to a proximity communication protocol. In some embodiments, address translation and the proximity communication protocol may be implemented in control logic on the carrier semiconductor die.

In general, an "engine," as discussed above and below, is a unit that encapsulates and fulfills a particularly function or set of functions. In an exemplary embodiment, an engine includes a CPU plus several layers of cache or memory. For example, an engine may include a CPU plus cache levels L1, L2 and a large L3 cache. Such an engine fulfills the instruction set architecture of a computer. In another embodiment, an engine includes of a centralized controller plus several levels of cache and/or memory.

The semiconductor dies in the SCM 408 may be coupled to a cable, such as the cable 120-1 (FIGS. 1A and 2A). The cable may include multiple arms 432 or pedals. In an exemplary embodiment, the cable includes four arms 432. In the embodiment 400, two arms 432 are shown. In other embodiments, there may be fewer or more arms. The flexibility compliance of a flex PW portion of the cable may allow at least a portion of the cable, such as at least a portion of the arms 432, to be positioned approximately parallel to the out-of-plane direction (Z) 410. As discussed previously, the cable and its arms 432 may include separate layers for power, for coupling data signals to and from the memory devices 414 and 416, and for coupling data signals to and from the memory devices 426 and 428.

As discussed below with reference to FIGS. 6 and 7, this configuration places the one or more memory devices 414, 416, 426 and 428 near to one or more SCMs but out of a plane containing a plurality of SCMs. In this way, adjacent and/or neighboring SCMs may communicate using high-bandwidth proximity communication and communicate with the one or more memory devices 414, 416, 426 and 428 using high-bandwidth, low latency links. In some embodiments, processor-to-memory and processor-to-processor communication may occur along separate paths without mutual congestion. This configuration, therefore, provides a self-contained logic structure or unit that offers considerable logical potency and simplified external connectivity. This logic unit, which is referred to as an engine in this discussion, may form a building block for constructing a larger server computer in the form of a MCM.

One or more of the arms 432 may be coupled to one or more VRMs 412, such as a power regulator and/or a power converter (for example, a DC-to-DC converter). The one or more VRMs 412 may provide power to one or more of the semiconductor dies in at least the SCM 408. In an exemplary embodiment, the VRMs 412 provide approximately 2.5 V power signals. In some embodiments, additional VRMs (not shown) that are coupled to the arms 432 near the central section of the cable may provide approximately 1 V, high-current power signals to the one or more semiconductor dies in at least the SCM 408.

One or more memory devices 414 and 416 may be coupled to the arms 432. In an exemplary embodiment, 4 or 5 memory devices are coupled to one another forming a stack. Two or more stacks of memory devices are coupled (for example, soldered or wire-bonded) to an outer surface of each of the arms 432. As discussed below, in this way the SCM 408 may be coupled to a large number of memory devices (for example, 32 or 36) that constitute inboard memory or an external memory cache, such as an L3 cache. This inboard memory may reduce a need or frequency with which a respective processor or CPU accesses main memory.

In some embodiments, the arms 432 may use rigid PW in a region 120-4 proximate to the VRMs 412 and/or one or more memory devices 414 and 416. In some embodiments, the arms 432 may include one or more memory connectors, such as SIMMs and/or DIMMS, for coupling to the one or more memory devices 414 and 416.

The arms 432 may be coupled to optional connectors 418. The connectors 418 may, in turn, be coupled to cables 420. In some embodiments, the arms 432 are coupled to the cables 420 without using the connectors 418. The cables 420 may be short-range signal cables. The cables may include several metal and dielectric layers that constitute a plurality of transmission lines, where each transmission line has a bandwidth in the range of 1-10 GHz. In an exemplary embodiment, the cables 420 have a width of approximately 18 mm and a length of approximately 500 mm.

The cables 420 may be coupled to connectors 434. The connectors 434 may be coupled to circuit boards 422. The circuit boards 422 may be coupled to the one or more memory devices 426 and 428. In some embodiments, the circuit boards 422 may include one or more memory connectors, such as SIMMs and/or DIMMS, for coupling to the one or more memory devices 426 and 428. The circuit boards 422 may be coupled to one or more memory controllers 424. The memory controllers 424 may support signal regeneration, fan-in, fan-out and/or multiplexing of signals.

The memory devices 414 and 416 may have access times less than a second threshold value and memory devices 426 and 428 may have access times greater than the second threshold value. The memory devices 414 and 416 may constitute inboard memory or an external memory cache for one or more processors or CPUs in at least the SCM 408. The memory devices 426 and 428 may constitute outboard memory or main memory for one or more processors or CPUs in at least the SCM 408. In an exemplary embodiment, the memory devices 414 and 416 may be fast SRAMs and/or DRAMs and the memory devices 426 and 428 may be commodity DRAMs, i.e., DRAMs having a large aggregate logical size and a relatively low cost.

In some embodiments, there is coordination between the L3 controller and the memory controllers 424. This allows data migration within a memory hierarchy in a respective engine to be self contained. When another engine in a system (such as an MCM) requests reading or writing of respective data in the respective engine, details and complexity of address translation and caching are transparent and virtually invisible. Except for timing details, the other engine does not know if the respective data is in the L3 cache (such as the memory devices 414 and/or 416) and/or the main memory (such as the memory devices 426 and/or 428) of the respective engine. This enables simplification and uncoupling of the engines, resulting in a decentralized computing structure. Thus, in some MCM embodiments there may not be a centralized directory for address translation.

The circuit boards 422 may be coupled to one or more VRMs 430. The one or more VRMs 430 may provide power to one or more of the memory devices 414, 416, 426 and 428. In MCMs, such as those discussed below with reference to FIGS. 6 and 7, the VRMs 412 and/or 430 may be coupled to a power distribution louver (not shown). The power distribution louver may include laminated bus bars that provide 12 V input power signals to the VRMs 412 and/or 430. A cooling louver (not shown) may provide cooling for the memory devices 414, 416, 426 and/or 428 as well as the VRMs 412 and/or 430 using a louver-shaped cooling device that is thermally coupled to these components. The thermal coupling to the cooling louver may occur via a thermal interface material, such as a thin layer of oil. The cooling louver may include a copper conduit for flowing water. The power louver and the cooling louver may be mutually parallel, with large open regions through which a respective engine may be inserted and/or removed.

The components in a respective engine, such as the SCM 408, as well as the completed structure shown in the embodiment 400 may undergo full burned-in testing, including a range of frequencies, a range of power, a range of temperature, a range of functionality and/or accelerated testing, prior to acceptance and assembly in the respective engine and/or the MCM. If necessary, this may allow the SCM 408 and/or the respective engine to be reworked prior to assembly in the MCM. In some embodiments, SCM 408, the cable and the memory devices 414, 416, 426 and 428 may be replaceably attached in the MCM. This may allow the SCM 408 to be reworked, i.e., connected, later disconnected, and then reconnected again. As a consequence, the SCM 408, as well as one or more other SCMs, may be removed from the MCM and one or more substitute SCMs may be inserted in their place. The ability to perform full burn-in testing and replace one or more chips and/or SCMs in the MCM represents a solution to what is classically described as the "Known Good Die Problem." In particular, initial yield of the engines may not degrade subsequent assembly.

It should be understood that FIG. 4 is illustrative of the components and functionality of the embodiment 400. In some embodiments, there may be additional or fewer components (for example, the memory devices 414 and 416 or the memory devices 426 and 428 may be eliminated), relative positions of two or more components may be changed, and two or more components may be combined into a single component. In some embodiments, the cables 420 may not be bent. As a consequence, the memory devices 414 and 416 and the circuit boards 422 may be positioned in a direction that is approximately parallel to the out-of-plane direction (Z) 410.

Figure 5:
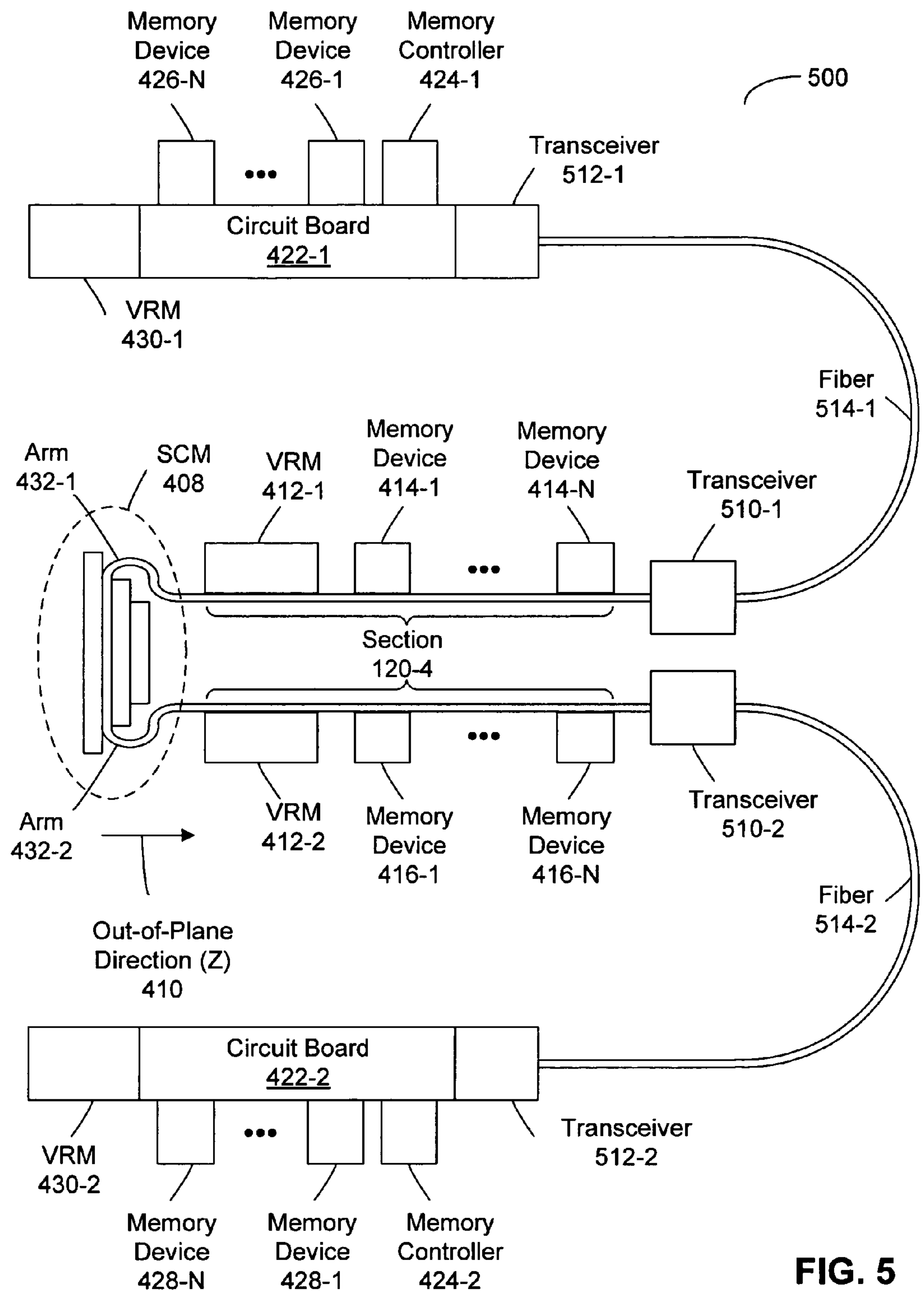
FIG. 5 is a block diagram illustrating an embodiment of a single-chip module coupled to memory devices.

While electronic transmission lines, such as those in the cables 420, are useful, there may be limits on a maximum transmission distance, a maximum frequency (i.e., a maximum bandwidth) and/or a maximum density of lines. In some embodiments, therefore, photonic signaling over one or more optical fibers is used. This is shown in FIG. 5, which is a block diagram illustrating an embodiment 500 of the SCM 408 coupled to the memory devices 414, 416, 426 and 428. In the embodiment 500, the connectors 418 and 434 (FIG. 4) have been replaced by electro-optic transceivers 510 and 512, and the cables 420 (FIG. 4) are replaced with one or more optical fibers 514 or cables configured for optical communication. One or more of the optical fibers 514 may include one or more embedded optical waveguides.

It should be understood that FIG. 5 is illustrative of the components and functionality of the embodiment 500. In some embodiments, there may be fewer or additional components, relative positions of two or more components may be changed, and two or more components may be combined into a single component.

Attention is now directed towards embodiments of the MCM that include a plurality of SCMs that are arranged in a 2-dimensional array. FIG. 6 is a block diagram illustrating a cross-sectional view of an embodiment of a MCM 600 that includes a plurality of SCMs 608. The MCM 600 may include a cold plate 610. The cold plate may be made of copper or copper alloys, such as copper-silicon-chromium or copper-tellurium, and may have a coolant flowing inside of it. Embodiments of thermal structures, such as the cold plate 610, are described in U.S. Pat. No. 5,388,635, the contents of which are herewith incorporated by reference.

The flowing coolant may be a single-phase liquid coolant, such as cool water, oils, hydro-carbons and/or fluro-carbons, or a phase-change coolant, such as organic solvents, hydro-carbons, fluro-carbons, liquid/vapor refrigerants and/or liquid/vapor water in a heat pipe. Alternatively, gas coolants may be used, such as air and/or helium. Cooling may be implemented by thermo-mechanical or thermoelectric techniques. In an exemplary embodiment, single-phase forced convention using cool water and a small hydrostatic pressure may be used. In other embodiments, piston cooling or direct impingement cooling may be used. In direct impingement cooling, the cold plate 610 includes an array of nozzles. Coolant squirts through the array of nozzles onto the outer surface of each SCM 608 in the MCM 600. In an exemplary embodiment, the MCM 600 has a temperature increase of 75 C at 120 W/cm$^2$ with 10 kW dissipated in the MCM 600.

The plurality of SCMs 608 may utilize proximity communication. Semiconductor dies 110-1 and 110-3 may include tiny arrays of capacitive terminals, electronic devices for proximity signaling and steering, wiring for signals, as well as logic hardware and protocol firmware for proximity communication. The cables 120 may be coupled to one or more memory devices (not shown) approximately parallel to the out-of-plane direction (Z) 410 of the MCM 600 in an architecture such as that illustrated in embodiments 400 (FIG. 4) and/or 500 (FIG. 5). While two SCMs 608 are illustrated in the MCM 600, there may be additional SCMs 608. While the SCMs 608 are illustrated with carrier semiconductor dies 110-1 and 110-3, in other embodiments at least some of the SCMs 608 may include one or more payload semiconductor dies, such as the semiconductor die 110-2 (FIG. 2A).

The SCMs 608 may be positioned in a jig plate 614 that is on top of the cold plate 610. There may be a thin layer of oil as a thermal interface material between the SCMs 608 and the cold plate 610. The jig plate 614 may accurately align the SCMs 608 parallel to a top surface of the cold plate 608 and/or along the out-of-plane direction (Z) 410 using structures that enable self-aligning, self-adjusting and/or self-balancing. This may facilitate proximity communication between adjacent or proximate SCMs 608 via bridge chips 612.

The jig plate 614 may include multiple instances of mounting structures into which SCMs 608 may be inserted. In some embodiments, the SCMs 608 may be removeably inserted into the mounting structures. The mounting structures may provide long-range coarse alignment between the SCMs 608 and the bridge chips 612 such that there is overlap between two or more of the plurality of proximity connectors 112 and proximity connectors (not shown) on the bridge chips 612. In some embodiments, the jig plate 614 may provide coarse alignment in the out-of-plane direction (Z) 410, for example, by including a global reference or stop in each of the mounting structures.

In some embodiments, the jig plate 614 and/or the MCM 600 may include components and structures that enable self-alignment and/or self-adjustment. This may include alignment features (defined using photolithographic techniques and/or chemical machining techniques, such as those used in processing of MEMS) and a means, such as one or more springs, that apply a controlling or restoring force. These components and structures may allow small free movement of each SCM 608. When each SCM 608 is assembled into the MCM 600, these components gently position each SCM 608 into correct alignment (i.e., alignment that is within an acceptable tolerance for proximity communication or that can be further corrected for using techniques such as electronic steering). These components operate during initial assembly and throughout the life of the MCM 600. They help reduce initial perturbations associated with fabrication and assembly tolerances, as well as cyclic perturbations, such as distortions from thermal or mechanical changes. The self-alignment and/or self-adjustment by components in the MCM 600 may reduce the need for precise fabrication and precise assembly of the MCM 600, and may reduce sensitivity to operating perturbations. This may reduce costs associated with the MCM 600 and may facilitate fabrication and assembly.

In some embodiments, the jig plate 614 may be fabricated from silicon or other covalent crystal wafers using micro electromechanical systems (MEMS) techniques. Silicon has suitable elastic properties and is not subject to inelastic (plastic) deformation. Silicon may, however, be vulnerable to cracking due to excessive stress. Structures that concentrate stress, such as sharp corners and narrow necks, may be undesirable. The jig plate 614 and the SCMs 608 may, therefore, have one or more chamfered or rounded corners.

In other embodiments, the jig plate 614 may include metal or glass. Fabrication techniques include liquid chemical machining, laser processing and/or reactive ion etching. A metal jig plate 614 may allow fabrication of a jig plate 614 that is larger than a current tooling limit for silicon wafers. Metal may also be resistant to in-plane stresses relative to silicon. Depending on a composition, however, metal may be vulnerable to inelastic deformation, particularly in the out-of-plane direction (Z) 410. In addition, wet-etching of metals may provide isotropic etching. This may result in rounded edges and fabrication tolerances that are proportional to a thickness of the jig plate 614.

The bridge chips 612 may couple to proximity connectors on one or more sides and/or one or more corners of one or more of the semiconductor dies 110-1 and/or 110-3. The semiconductor dies 110-1 and/or 110-3 may be face up (with proximity connectors 112 on or proximate to a top surface) and the bridge chips 612 may be face down (with proximity connectors on or proximate to a bottom surface). In some embodiments, the semiconductor dies 110-1 and/or 110-3 may be face down and the bridge chips 612 may be face up. In some embodiments, there may be direct contact between the plurality of proximity connectors 112 and the proximity connectors (not shown) on the bridge chips 612. In other embodiments, proximity connectors 112 and the proximity connectors (not shown) on the bridge chips 612 may be recessed and/or separated by a thin protective layer.

Figure 6:
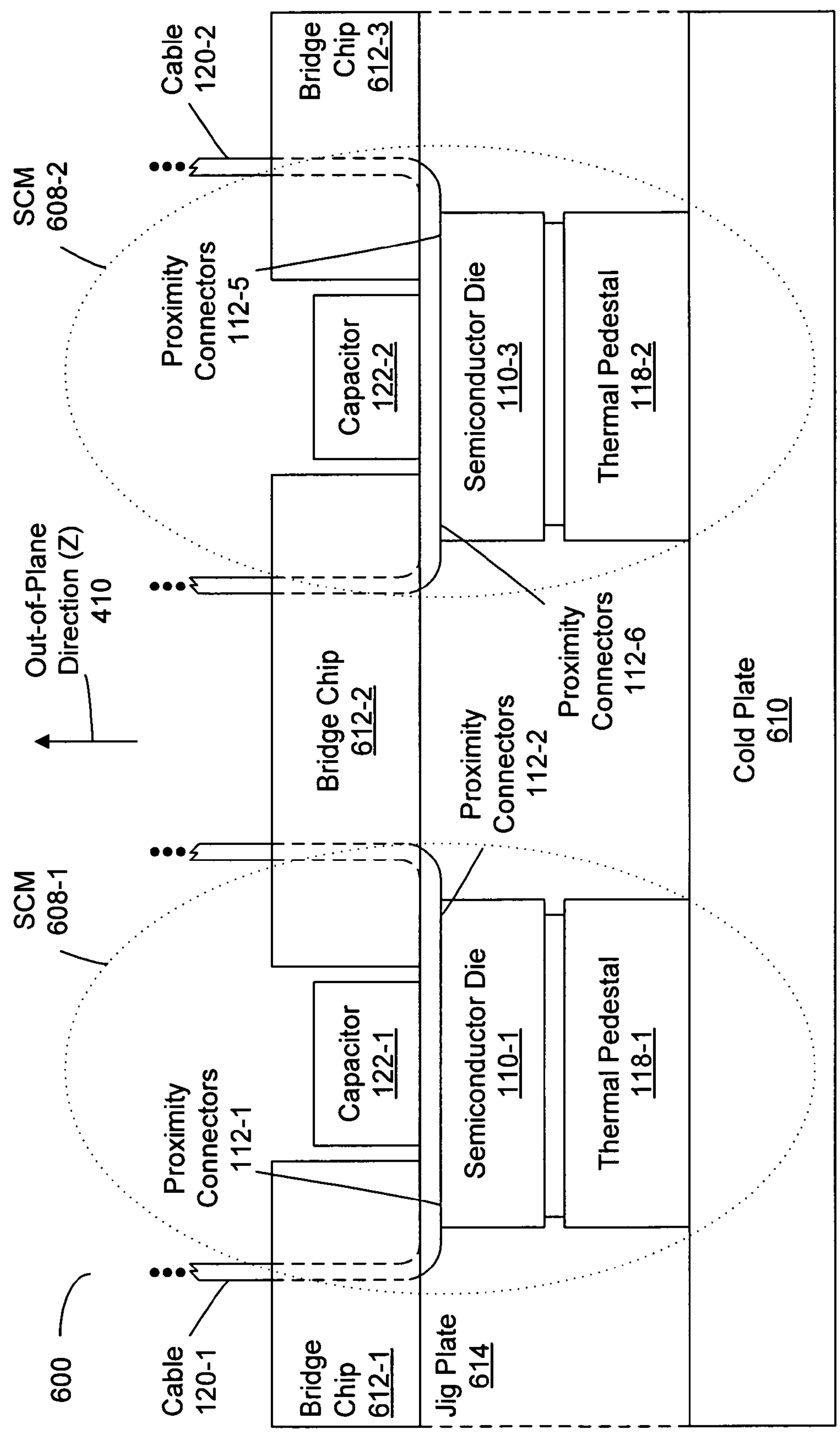
FIG. 6 is a block diagram illustrating a cross-sectional view of an embodiment of a multi-chip module.

It should be understood that FIG. 6 is illustrative of the components and functionality of the embodiment 600. In some embodiments, there may be additional or fewer components (such as zero or two or more jig plates 614), relative positions of two or more components may be changed, and two or more components may be combined into a single component.

FIG. 7 is a block diagram illustrating a top view of an embodiment of a MCM 700. The MCM 700 may include an array 710 that includes engines 3, such as those shown in embodiment 400 (FIG. 4), SCMs 2 that include network connections (such as one or more electro-optic transceivers and one or more optical cables) to other MCMs, and input/output devices 1 for communicating with arrays of magnetic or optical storage devices, such as hard disc drives and/or DVD drives. In some embodiments, alternate engines 3 in the array 710 may include either one or more processors/CPUs or one or more controllers. In these embodiments, a checker board pattern of processors and controllers may be used.

In an exemplary embodiment, the optical cables coupled to the SCMs 2 may use dense wavelength dynamic multiplexing and may have a data or symbol rate of 0.5 TB/s per carrier semiconductor die. Proximity communication between neighboring SCMs in the array 710 may have a latency of approximately 1 ns. Using fabrication technology with a 65 nm critical dimension, there may be a data or symbol rate of 15 TB/s per carrier semiconductor die. For a respective engine, a memory controller, such as the memory controller 424 (FIG. 4), may have four channels to fully buffered memory devices, such as the memory devices 426 and/or 428 (FIG. 4). A total bandwidth for all four channels may be 50 GB/s. In some embodiments, memory devices coupled to the engines 3 may be shared among one or more processors. In some embodiments, an L3 cache in a respective engine may be specific to a respective processor.

The thirty-two engines 3 in the array 710 may each have four arms or pedals coupled to four cables, such as the cables 420 (FIG. 4), and outboard memory. Thus, there may be a total of one-hundred and twenty-eight cables coupled to L3 caches and/or outboard memories. In addition, each processor or CPU in each of the engines 3 may be closely adjacent to four such cables. This translates to reduced latency for communication between the processors or CPUs and the L3 caches and/or outboard memories.

It should be understood that FIG. 7 is illustrative of the components and functionality of the embodiment 700. In some embodiments, there may be fewer or additional components, relative positions of two or more components may be changed, and two or more components may be combined into a single component.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A device, comprising:

a first semiconductor die having a first surface and a second surface, wherein the first semiconductor die is configured to communicate by capacitive coupling using one or more of a plurality of proximity connectors coupled to the first surface;

a cable coupled to the first semiconductor die; and at least one memory device coupled to the cable;

wherein a first section of the cable coupled to the first semiconductor die has a first flexibility compliance less than a threshold value, a second section of the cable coupled to at least the one memory device has a second flexibility compliance less than the threshold value, and a third section of the cable has a third flexibility compliance greater than the threshold value.

2. The device of claim 1, wherein at least the one memory device includes a semiconductor memory.

3. The device of claim 2, wherein the semiconductor memory comprises dynamic random access memory (DRAM).

4. The device of claim 2, wherein the semiconductor memory comprises static random access memory (SRAM).

5. The device of claim 2, wherein the semiconductor memory comprises magnetic random access memory (MRAM).

6. The device of claim 1, further comprising a second semiconductor die electrically coupled to the first semiconductor die, wherein the cable is further coupled to the second semiconductor die.

7. The device of claim 1, wherein the third flexibility compliance of the third section allows at least a portion of the cable to be positioned substantially perpendicular to a plane including the first surface.

8. The device of claim 1, wherein the cable includes at least one multilayer element, at least the one multilayer element having a first metal layer, a dielectric layer and a second metal layer, and wherein at least the one multilayer element comprises a transmission line.

9. The device of claim 8, wherein there are at least the two mechanically distinct multilayer elements in at least one section of the cable.

10. The device of claim 8, wherein there is at least one stiffener element in at least the one multilayer element in at least one section of the cable.

11. The device of claim 1, wherein the cable includes a central section coupled to the first semiconductor die, and wherein the cable has four arms coupled to the central section and arranged with substantially 4-fold symmetry.

12. The device of claim 1, wherein the cable further includes one or more memory connectors.

13. The device of claim 1, wherein at least the one memory device is a plurality of memory devices, and wherein a first subset of the plurality of memory devices are coupled to the cable proximate to a first end of the cable that is proximate to the first semiconductor die, and a second subset of the plurality of memory devices are coupled to the cable proximate to a second end of the cable that is distal from the first semiconductor die.

14. The device of claim 13, wherein memory devices in the first subset of the plurality of memory devices have access times less than a threshold value and memory devices in the second subset of the plurality of memory devices have access times greater than the threshold value.

15. The device of claim 13, further comprising a memory board coupled to the cable and the second subset of the plurality of memory devices.

16. The device of claim 15, further comprising a memory controller coupled to the memory board.

17. The device of claim 15, where in the memory board is coupled to the cable using a connector.

18. The device of claim 1, further comprising a first voltage regulator coupled to the cable proximate to a first end of the cable that is proximate to the first semiconductor die, wherein the first voltage regulator is configured to provide power to the first semiconductor die.

19. The device of claim 18, further comprising a second voltage regulator coupled to the cable proximate to a second end of the cable that is distal from the first semiconductor die, wherein the second voltage regulator is configured to provide power to at least the one memory device.

20. The device of claim 1, further comprising a first electro-optic transceiver coupled to the cable proximate to a first end of the cable that is proximate to the first semiconductor die.

21. The device of claim 20, further comprising a second electro-optic transceiver coupled to the cable proximate to a second end of the cable that is distal from the first semiconductor die.

22. The device of claim 20, wherein the cable includes one or more embedded optical waveguides.

23. A device, comprising:

a first semiconductor means having a first surface and a second surface, wherein the first semiconductor means is configured to communicate by capacitive coupling using one or more of a plurality of proximity connectors coupled to the first surface;

an interconnect means coupled to the first semiconductor die; and at least one memory means for providing information storage coupled to the interconnect means;

wherein a first section of the interconnect coupled to the first semiconductor means has a first flexibility compliance less than a threshold value, a second section of the interconnect coupled to at least the one memory means has a second flexibility compliance less than the threshold value, and a third section of the cable has a third flexibility compliance greater than the threshold value.

* * * * *